(12) United States Patent
Schuette

(10) Patent No.: US 9,009,959 B2
(45) Date of Patent: Apr. 21, 2015

(54) METHOD OF ASSEMBLING MASS STORAGE DEVICE FOR A COMPUTER SYSTEM

(75) Inventor: Franz Michael Schuette, Colorado Springs, CO (US)

(73) Assignee: OCZ Storage Solutions Inc., San Jose, CA (US)

( * ) Notice: Subject to any disclaimer, the term of this patent is extended or adjusted under 35 U.S.C. 154(b) by 489 days.

(21) Appl. No.: 13/586,979

(22) Filed: Aug. 16, 2012

(65) Prior Publication Data

US 2012/0304455 A1   Dec. 6, 2012

Related U.S. Application Data

(62) Division of application No. 12/783,978, filed on May 20, 2010, now Pat. No. 8,310,836.

(51) Int. Cl.
*G06F 3/06* (2006.01)
*G06F 1/18* (2006.01)
*H05K 5/02* (2006.01)

(52) U.S. Cl.
CPC ............ *G06F 1/187* (2013.01); *Y10T 29/49124* (2015.01); *Y10T 29/49069* (2015.01); *Y10T 29/49002* (2015.01); *G06F 3/0626* (2013.01); *G06F 3/0658* (2013.01); *G06F 3/0688* (2013.01); *H05K 5/026* (2013.01)

(58) Field of Classification Search
CPC ... G06F 3/0688; G06F 3/0689; G06F 3/0683; G06F 3/0658; G06F 1/187; H05K 5/026; Y10T 29/49002
See application file for complete search history.

(56) References Cited

U.S. PATENT DOCUMENTS

| | | | | |
|---|---|---|---|---|
| 6,024,607 | A * | 2/2000 | Wahl | 439/639 |
| 6,618,787 | B2 * | 9/2003 | Caselli et al. | 710/305 |
| 7,983,032 | B2 * | 7/2011 | Walker et al. | 361/679.33 |
| 8,446,729 | B2 * | 5/2013 | Schuette | 361/748 |
| 2008/0168257 | A1 * | 7/2008 | Marks et al. | 712/38 |
| 2010/0020515 | A1 * | 1/2010 | Rubino et al. | 361/803 |
| 2010/0049914 | A1 * | 2/2010 | Goodwin | 711/114 |
| 2010/0195289 | A1 * | 8/2010 | Hubal | 361/733 |

* cited by examiner

*Primary Examiner* — Livius R Cazan
(74) *Attorney, Agent, or Firm* — Hartman Global IP Law; Gary M. Hartman; Domenica N. S. Hartman

(57) ABSTRACT

A method and mass storage device that combine multiple solid state drives (SSDs) to a single volume. The device includes a carrier board and at least two solid state drives having power and data connections to the carrier board. The carrier board includes a circuit board functionally connected to a control logic and at least two secondary connectors that are disposed at different edges of the circuit board and functionally connected to the control logic. The solid state drives are connected to the carrier board through the secondary connectors, and each solid state drive has a power and data connector directly connected to one of the secondary connectors of the carrier board. The solid state drives are oriented substantially parallel to the carrier board and to each other.

7 Claims, 5 Drawing Sheets

METHOD OF ASSEMBLING MASS STORAGE DEVICE FOR A COMPUTER SYSTEM

CROSS REFERENCE TO RELATED APPLICATIONS

This is a division application of U.S. patent application Ser. No. 12/783,978, filed May 20, 2010, now U.S. Pat. No. 8,310,836.

BACKGROUND OF THE INVENTION

Mass storage devices in personal computers and servers typically use rotatable media-based hard disk drives (HDDs), featuring one or more magnetic platters as the data carrier and a read/write head positioned over the relevant sector by means of an actuator. In recent years, the trend has been to miniaturize these HDDs such that currently the largest form factor is the 3.5 inch (about 8.9 cm) drive. The 3.5 inch drive is still the predominant device in desktop computers where they are typically mounted in drive bays. In the notebook sector, 2.5 inch (about 6.35 cm) drives are more commonly used in a slim form factor mounted in a specialized compartment in the chassis. With respect to the mounting considerations for the drive, aside from the actual physical dimensions, the weight of the HDD plays an important factor, in that certain prerequisites for the fixture have to be met. Moreover there are also some orientational factors that have to be taken into consideration, for example, drives mounted at an angle appear to have higher wear on their bearings than drives that lie flat with the spindle axis in a vertical orientation. Last but not least, the actuator movements entail enough mass displacement to cause some movements of the entire drive. Primarily because of the weight and stability concerns outlined above, hard disk drives are generally mounted in specialized drive bays within the chassis, often using rubber grommets to dampen vibrations and shock. Power and data connections are done through cabling to the motherboard or any add-on host-bus controller as well as the power supply unit.

The recent introduction of solid state drives (SSDs) into the market has eliminated some of the above concerns. An example of a conventional SSD 10 is schematically represented in FIG. 1 as comprising a printed circuit board 12 equipped with a power and data connector 14, multiple memory chips 16 and a control logic (controller) integrated circuit (IC) chip 18. The memory chips 16 typically comprise flash (e.g., NAND) non-volatile memory chips or another non-volatile memory technology. The connector 14 is shown as a male SATA connector that faces outward and away from the interior of the circuit board 12 to enable the SSD 10 to be connected to a cable of a computer system (not shown). SSDs of the type shown in FIG. 1 can be slimmer and lighter than conventional HDDs, and lack moving parts so that they do not vibrate during operation and have almost unlimited shock resistance. Likewise, they are not sensitive to any orientation whatsoever. However, a major drawback of current SSDs is their limited capacity compared to rotatable media. Even though there is a significant cost overhead for SSDs compared to HDDs, there is a market for large capacity SSDs. However, the current generation of controllers is not capable of addressing NAND memory space equivalent to the capacity of HDDs. Future generations of SSDs will be able to address higher densities of NAND flash, however, at the same time, capacity of HDDs will also have increased, resulting in a paradigm shift only without solving the problem of lag in storage capacity from SSDs to HDDs.

Redundant arrays of independent drives (RAID) configurations, including Spanning over several volumes in a "just a bunch of drives" (JBOD) configuration have been in the market for decades. These configurations are generally enabled using dedicated RAID cards with an ISA, PCI or PCI express (PCIe) interface. However, in this case, the system integrator still faces the issue of dedicated cabling and mounting hardware for each of the drives used in the array. Commonly-assigned U.S. patent application Ser. No. 12/713,349 to Schuette, whose contents are incorporated herein by reference, discloses such a system using a direct-mounting scheme of SSDs on a carrier board.

An emerging issue with striped RAID using SSDs is that the data transfer rates of the latest drives are reaching saturation of the host bus adapters and, in the case of high-end drives, easily saturate the logic interconnect of the entire computer system. In so far, it is not absolutely necessary to focus on raw bandwidth, as a single SATA (Serial Advanced Technology Attachment) interface may suffice. In addition, particularly the enterprise market is using precisely defined form factors for all components, and custom designs often cannot be implemented. A desirable solution would therefore be an implementation of several drives within an industry-standard HDD enclosure to warrant optimal compatibility with any existing system infrastructure.

BRIEF DESCRIPTION OF THE INVENTION

The present invention provides a relatively uncomplicated method and mass storage device for achieving large-capacity solid state drives by combining SSDs to a single volume to achieve capacity that can approach that of high-end HDDs, while also maintaining an industry standard form factor compatible with existing infrastructures.

According to a first aspect of the invention, the mass storage device includes a carrier board and at least two solid state drives having power and data connections to the carrier board. The carrier board comprises a circuit board functionally connected to a control logic and at least two secondary connectors disposed at different edges of the circuit board and functionally connected to the control logic through the circuit board. The solid state drives are connected to the carrier board through the secondary connectors of the carrier board. Each of the solid state drives has a power and data connector that faces an interior surface region of the solid state drive and is directly connected to one of the secondary connectors of the carrier board. The solid state drives are oriented substantially parallel to the carrier board and to each other.

According to a second aspect of the invention, the method entails providing a carrier board comprising a circuit board functionally connected to a control logic and secondary connectors disposed at different edges of the circuit board and functionally connected to the control logic through the circuit board. At least two solid state drives are directly connected to at least two of the secondary connectors of the carrier board to provide power and data connections therebetween. Each of the solid state drives has a power and data connector that faces an interior surface region of the solid state drive and is directly connected to one of the secondary connectors of the carrier board and is mounted by the connectors so as to be oriented substantially parallel to the carrier board and to each other.

In view of the above, the current invention is capable of combining several small form factor SSDs in an enclosure that preferably conforms to an industry standard for a single HDD as used in conventional personal computers and servers. Each SSD comprises a circuit board modified to use a female connector, instead of a male connector conventionally used.

Furthermore, the female connectors are in an inverted orientation by which the connector faces inward toward the interior of the circuit board instead of outward away from the circuit board. The SSDs are interconnected with a secondary circuit board (carrier board) oriented substantially parallel to the planes of the individual SSD circuit boards. In preferred embodiments, the carrier board is sandwiched between two or more SSD circuit boards, and the SSD circuit boards overlap each other in opposite orientation so that their respective female connectors are at opposite ends/sides of the enclosure. The female connectors of the SSD circuit boards plug into male connectors on the carrier board, and the SSDs of the enclosure can be interconnected with a computer system with another connector provided on the carrier board and preferably located at the periphery of the enclosure to be accessible from the exterior of the enclosure.

Notable but nonlimiting advantages of the current invention can be summarized as follows. The mass storage device, including its enclosure containing the SSD circuit boards and carrier board, can have an ultra-compact design capable of fitting into a standard drive form factor, such as a 3.5 inch drive form factor. The mass storage device can also have a modular configuration that allows removal and replacement of its components, such as its SSD circuit boards and carrier board for maintenance. The mass storage device can employ relatively low cost standard connector configurations, and can be implemented with little or no redesign of existing SSD circuit boards, such as 2.5 inch SATA SSD circuit boards.

Other aspects and advantages of this invention will be better appreciated from the following detailed description.

DETAILED DESCRIPTION OF THE INVENTION

Figure 1:
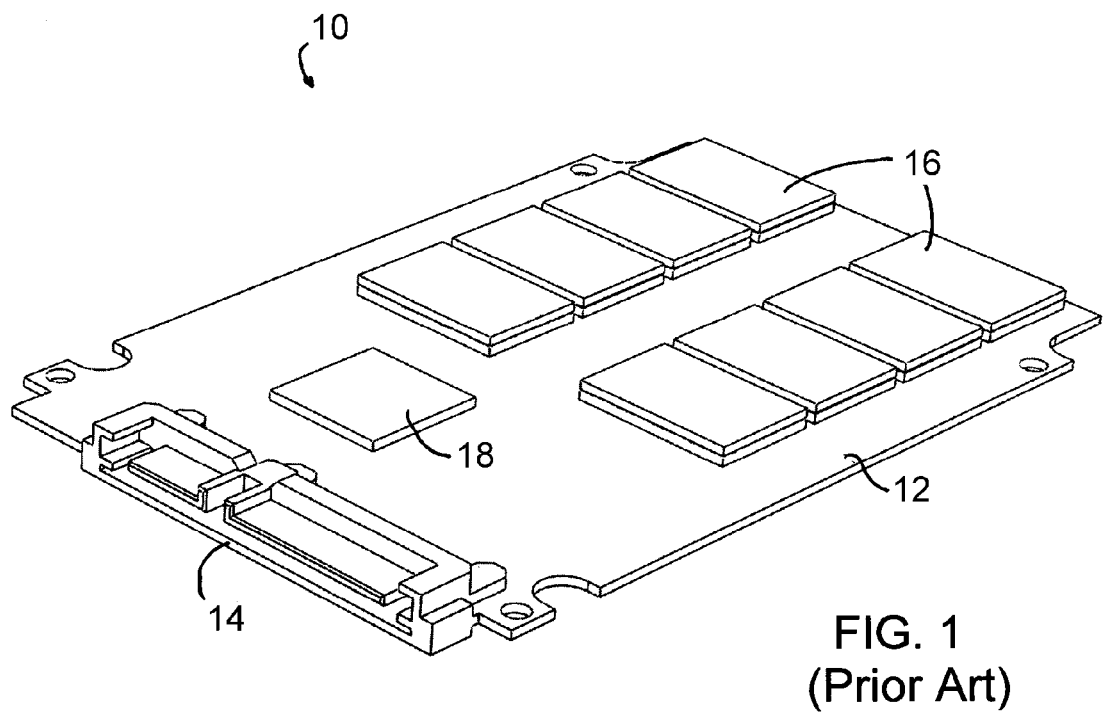
FIG. 1 represents a schematic view of a circuit board used in a conventional SSD, equipped with a male SATA connector facing away from the board in accordance with prior art practice.
Figure 2:
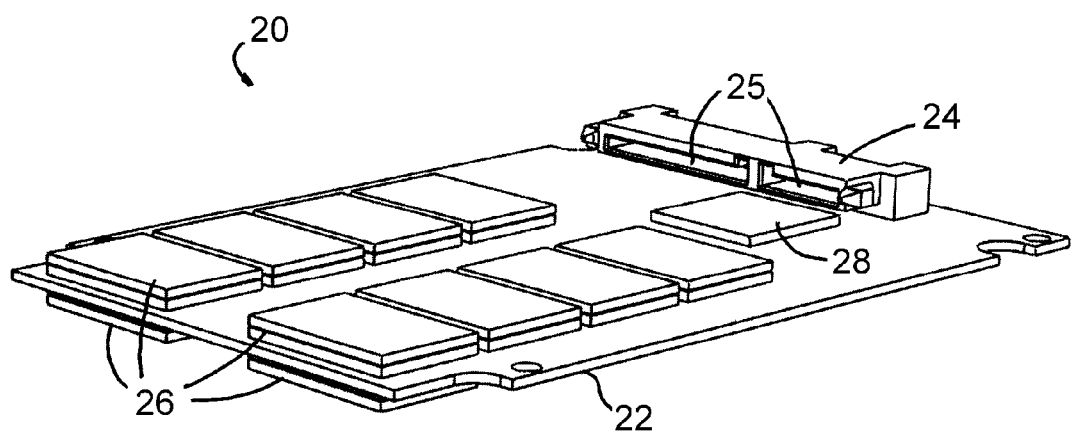
FIGS. 2 and 3 are schematic representations of SSD circuit boards similar to that of FIG. 1, but each modified to feature a female connector in an inverted orientation, such that receptacles thereof face toward the interior of each board in accordance with a preferred aspect of the present invention.
Figure 3:
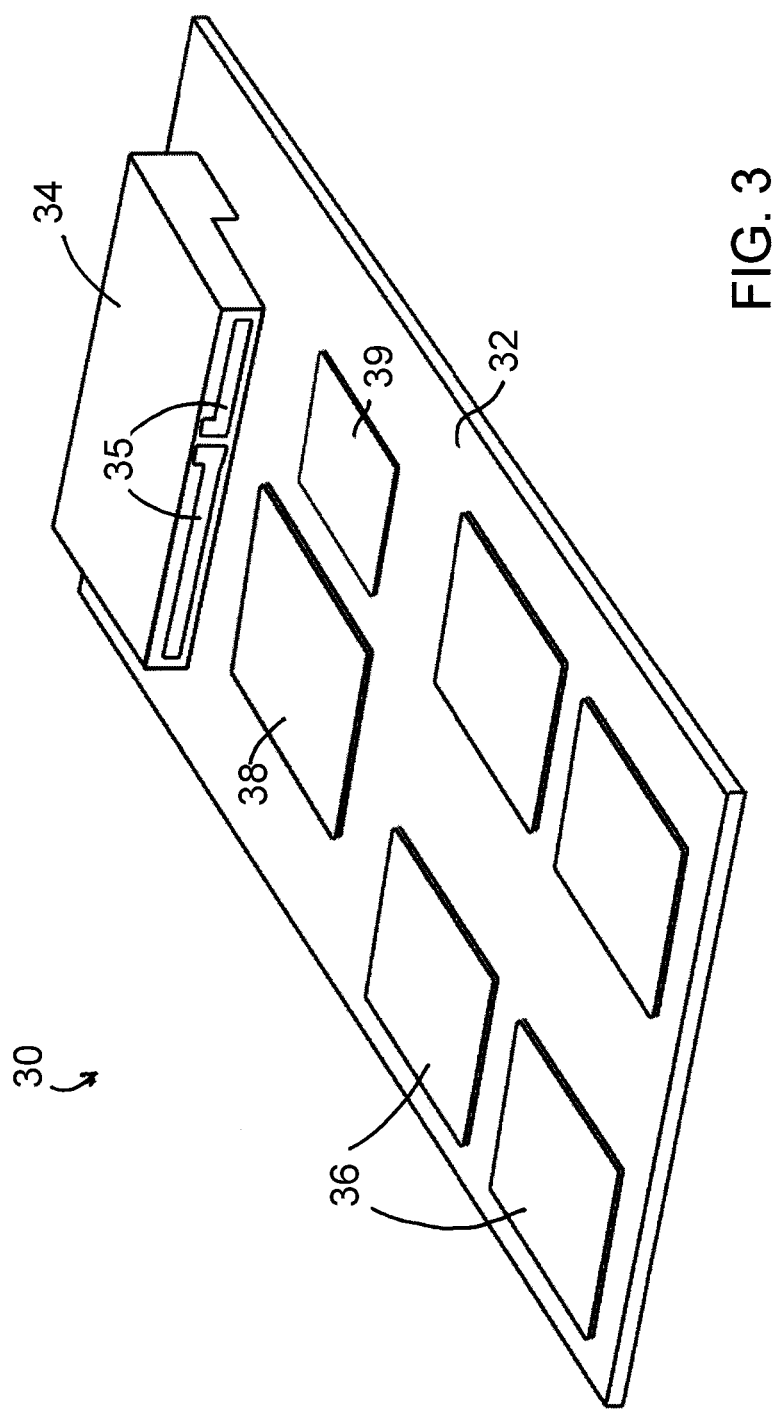

FIGS. 2 and 3 represent SSDs 20 and 30 that are similar to the prior art SSD 10 of FIG. 1, in terms of comprising printed circuit boards 22 and 32 equipped with power and data connectors 24 and 34, multiple memory chips 26 and 36, and control logic (controller) IC chips 28 and 38, which are appropriately electrically connected with traces (not shown) on the surfaces of the circuit boards 22 and 32. The memory chips 26 and 36 may be of various types known in the art, preferably flash non-volatile memory chips such as NAND or another non-volatile memory technology such as phase change memory (PCM), though the use of other memory technologies is also possible, such as DRAM volatile memory. The circuit boards 22 and 32 and chips 26, 28, 36 and 38 can be of types commercially available and known to those skilled in the art, and therefore will not be discussed in any detail here. In addition, the connectors 24 and 34 are represented as SATA connectors that are commercially available and well known to those skilled in the art. As with SSDs of the type shown in FIG. 1, the SSDs 20 and 30 of FIGS. 2 and 3 are capable of being slimmer and lighter than conventional HDDs and lack moving parts, such that the SSDs 20 and 30 do not vibrate during operation and are more shock resistance than conventional HDDs. The SSD 20 of FIG. 2 comprises flash chips 26 on each of the opposite surfaces of the circuit board 22, whereas the chips 36 of the SSD 30 of FIG. 3 are located on only one side of the circuit board 32. The SSD 30 is further represented as having a cache IC chip 39 mounted on its circuit board 32.

The SSDs 20 and 30 of FIGS. 2 and 3 differ in part from the SSD 10 of FIG. 1 as a result of being equipped with female connectors 24 and 34 having an inverted orientation, which as used herein means that their receptacles 25 and 35 face toward the interiors of their respective SSD circuit boards 22 and 32 instead of outward away from the circuit boards 22 and 32. Such an orientation is in contrast to the conventional outward orientation of the connector 14 relative to the circuit board 12 in FIG. 1. Furthermore, the connectors 24 and 34 are female and not male, again in contrast to the connector 14 of FIG. 1.

Figure 4:
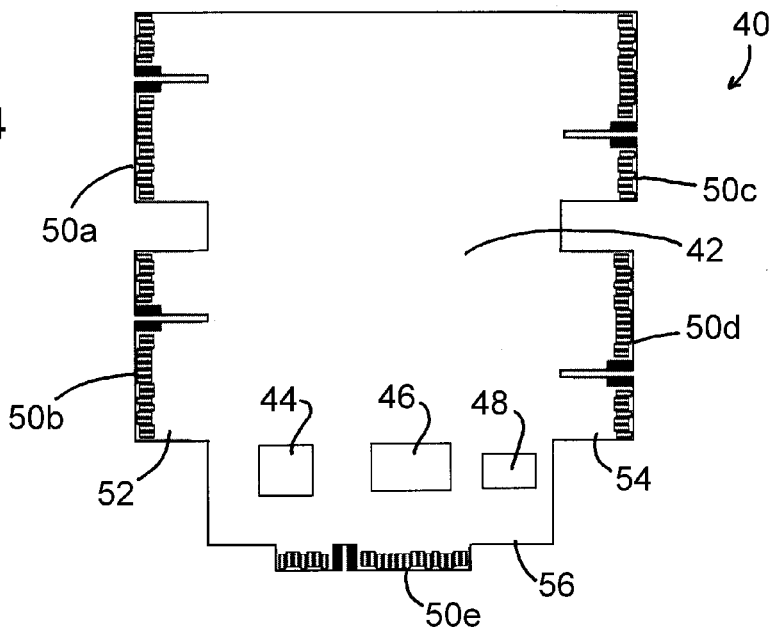
FIGS. 4 and 5 are schematic representations of carrier boards capable of use in combination with either or both SSD circuit boards of FIGS. 2 and 3 to yield a mass storage device assembly in accordance with an embodiment of the present invention.
Figure 5:
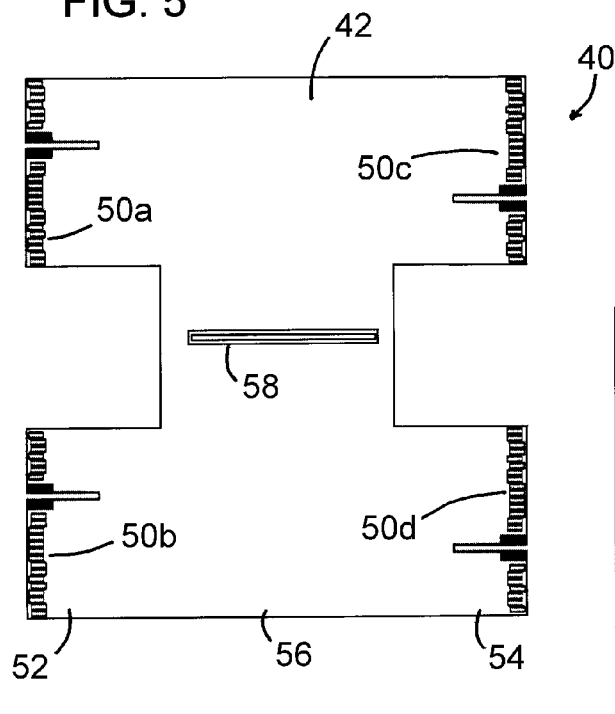

FIGS. 4 and 5 are schematic representations of carrier boards 40 suitable for use in combination with either or both of the SSDs 20 and 30 of FIGS. 2 and 3 to yield a mass storage device assembly in accordance with preferred aspects of the present invention. The carrier board 40 shown in FIG. 4 comprises a printed circuit board 42 equipped with a RAID controller IC chip 44, cache chip 46, read only memory (ROM) IC chips 48, and five male edge connectors 50a-e plated onto the circuit board substrate. As with the SSDs 20 and 30 of FIGS. 2 and 3, the circuit board 42 and chips 44, 46 and 48 can be of types commercially available and known to those skilled in the art, and therefore will not be discussed in any detail here. The edge connectors 50a-e are shown as featuring a staggered pin-out configuration typical of a standard SATA interface, though other pin configurations are also within the scope of the invention. The two connectors 50a and 50b located along one edge 52 of the carrier board 40 are referred to herein as secondary data connectors that feature pins placed or located at the frontside (visible in FIG. 4) of the carrier board 40, and the two connectors 50c and 50d located along the opposite edge 54 of the carrier board 40 are also secondary data connectors that feature pins placed or located at the backside (not visible in FIG. 4) of the carrier board 40.

Each male connector 50a-50d along the edges 52 and 54 of the carrier board 40 is configured to connect with an inverted female connector of an SSD circuit board, such as (but not limited to) the SSDs 20 and 30 of FIGS. 2 and 3. The carrier board 40 and SSDs 20 and 30 are configured so that SSDs 20 and/or 30 can be individually connected to the connectors 50a or 50b of the carrier board 40 so that at least one SSD 20 and/or 30 is located on the frontside of the board 40, and SSDs 20 and/or 30 can be individually connected to the connectors 50c or 50d of the carrier board 40 so that at least one SSD 20 and/or 30 is located on the backside of the board 40. As a result, with the carrier board 40 as configured in FIG. 4, one or more SSDs 20 and/or 30 can be located and mounted on the frontside of the board 40, and therefore on the opposite side of the board 40 and in overlapping relationship with one or more SSDs 20 and/or 30 located and mounted on the backside of the board 40. Furthermore, the SSDs 20 and/or 30 can be mounted parallel to the carrier board 40 and to each other. To enable the connections described above, the connectors 50a-50d of the carrier board 40 are preferably male SATA connectors with pins on the frontside and backside surfaces of the circuit board 42 for connecting with the female SATA connectors 24/34 of the SSDs 20/30. The fifth connector 50e of the carrier board 40 is located along a third edge 56 of the board 40, and is referred to as a primary data connector in that it serves as the interface to a computer system to which the SSDs 20 and 30 can be connected through the carrier board 40.

Figure 6:
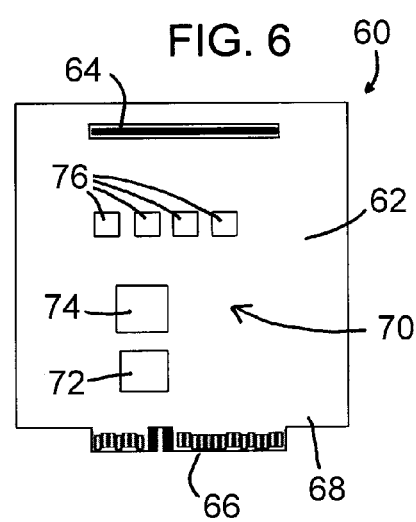
FIG. 6 schematically represents an interface/control board configured to be connected to the carrier board of FIG. 5 in accordance with an embodiment of the present invention.

FIG. 5 shows a carrier board similar to that of FIG. 4. For convenience, identical reference numerals are used in FIG. 5 to denote the same or functionally equivalent elements described for the carrier board 40 of FIG. 4. The carrier board 40 of FIG. 5 is similar to the board 40 of FIG. 4 in terms of comprising a printed circuit board 42 and four edge connectors 50a-d along its opposite edges 52 and 54. However, the board 40 of FIG. 5 lacks the controller IC chip 44 and the edge connector 50e of FIG. 4, and further includes a high-speed board-to-board connector 58 in place of the edge connector 50e of FIG. 4. The board-to-board connector 58 is located within the interior surface region of the circuit board 42, and is oriented transverse to the plane of the board 42 to facilitate connection with a board oriented parallel to the carrier board 40, such as an interface/control board 60 shown in FIG. 6. The interface/control board 60 includes a high-speed board-to-board connector 64 mounted to a printed circuit board 62 so as to be oriented for connecting to the board-to-board connector 58 of the carrier board 40 of FIG. 5. The interface/control board 60 further includes a system interconnect SATA connector 66 located along an edge 68 of the circuit board 62 and control logic 70 represented in FIG. 6 as including a SATA-to-PCIe translator 72, a PCIe-to-dual channel PATA translator 74, and a PATA-to-SATA multi-IC bridge 76 (shown as four PATA-to-SATA bridge ICs), all of which are well known to those skilled in the art and therefore will not be discussed in any detail here. Through its connector 66, the interface/control board 60 of FIG. 6 is able to serve as a computer system interface for the carrier board 40 of FIG. 5 and one or more SSDs (e.g., 20 and/or 30) mounted thereto.

Figure 7:
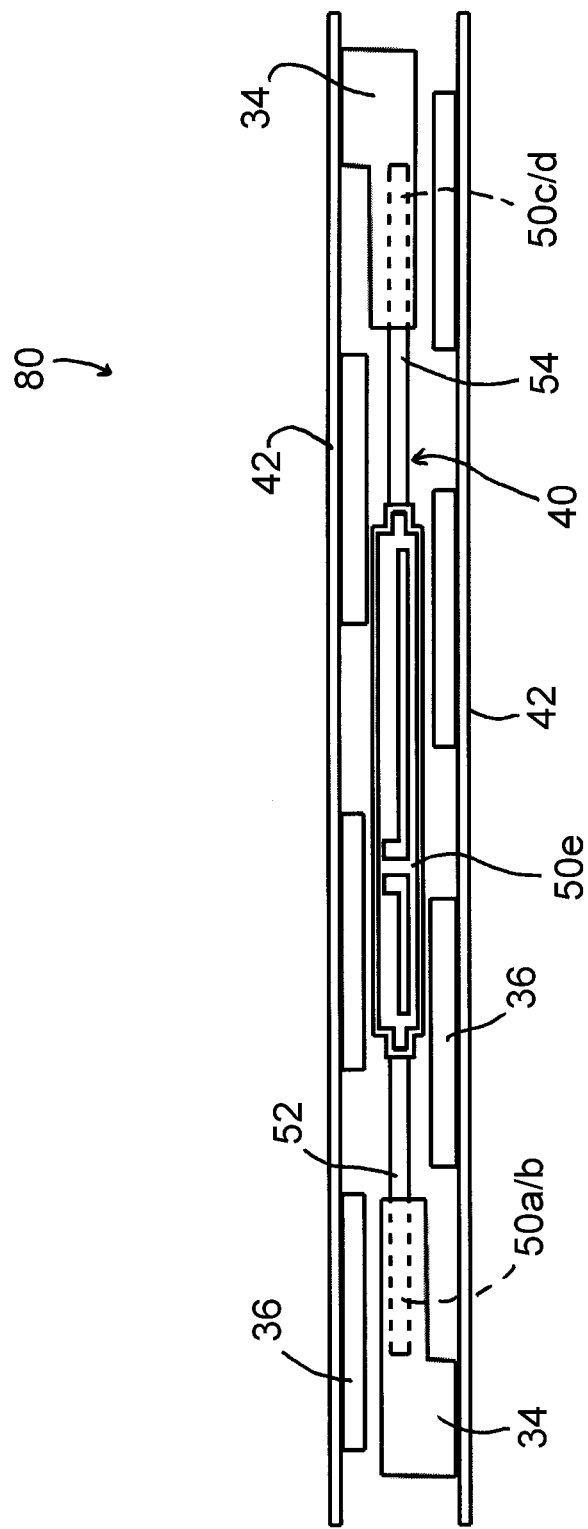
FIG. 7 represents an edge view of a mass storage device assembly comprising the carrier board of FIG. 4 between two SSDs, such as those of FIGS. 2 and/or 3, in opposite orientation and with their inward-facing female connectors connected to respective male connectors of the carrier board in accordance with an embodiment of the present invention.

FIG. 7 represents an edge view of a mass storage device assembly 80 comprising the carrier board 40 of FIG. 4 between at least two overlapping SSDs 30 of the type shown in FIG. 3, though it should be understood that the SSDs 20 of FIG. 2 could be used as well as other SSDs if configured for connecting to the board 40. Furthermore, in place of the carrier board 40 of FIG. 4, the assembly 80 could utilize the carrier board 40 of FIG. 5 and the interface/control board 60 of FIG. 6. The SSDs 30 are shown oppositely oriented to each other, in that their inward-facing female connectors 34 are directly connected to the male connectors 50a/b or 50c/d at opposite edges 52 and 54 of the carrier board 40 so as to be disposed at opposite sides of the assembly 80 in accordance with the previous discussion. Furthermore, the connectors 34 are between the circuit boards 32 of the SSDs 30, and therefore face each other and are contained within the interior of the assembly 80.

Figure 8:
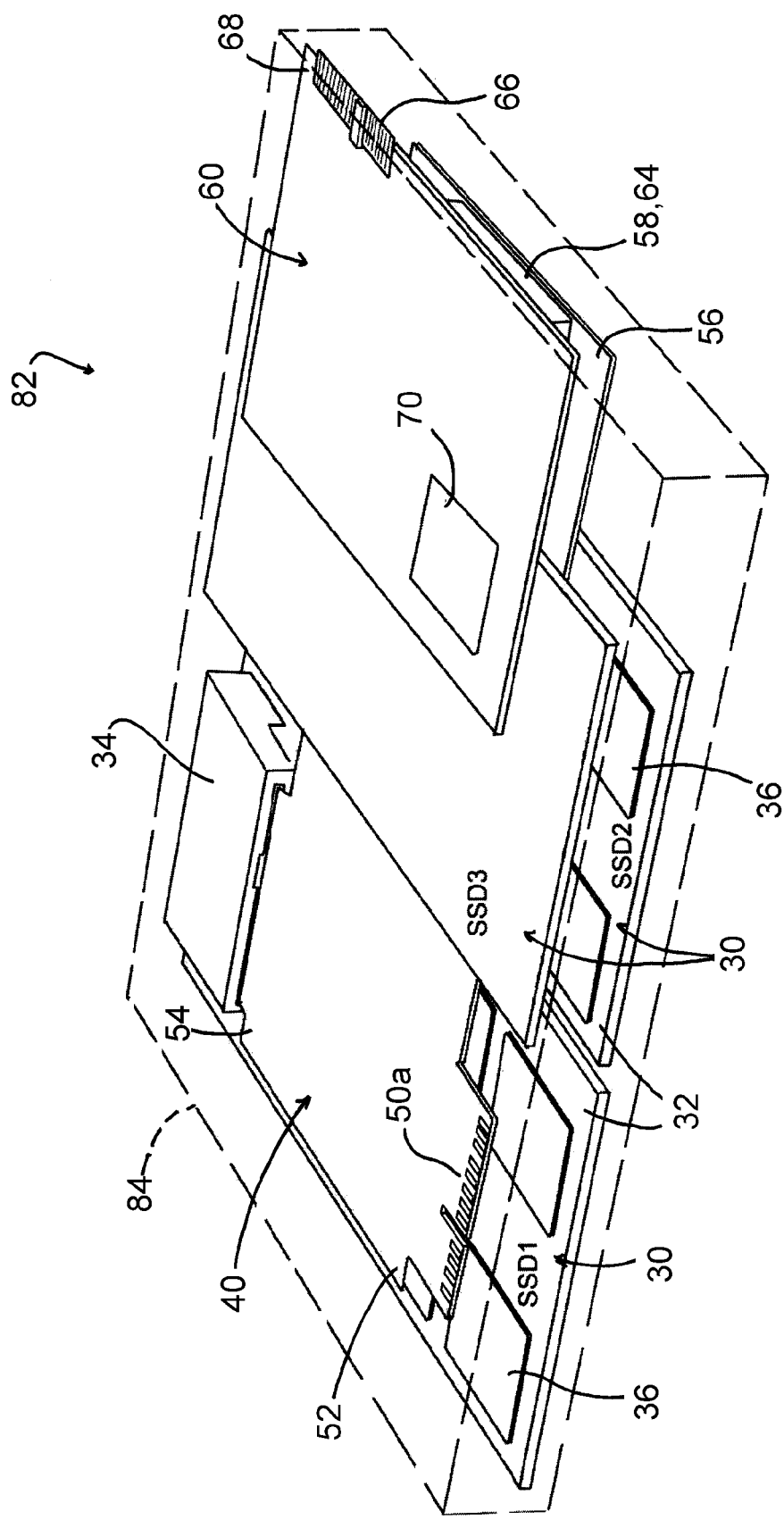
FIG. 8 is a perspective view showing the interior of a drive unit comprising three SSDs (for example, FIG. 1 and/or 3), a carrier board (for example, FIG. 5) and an interface/control board (for example, FIG. 6), all of which are contained within an enclosure in accordance with an embodiment of the present invention.

FIG. 8 is a perspective view showing the interior of an assembled drive unit 82 comprising an enclosure 84 (shown in phantom), three SSDs 30 (FIG. 3) mounted to a carrier board, and an interface/control board connected to the carrier board. The carrier board and interface/control board are identified by the same reference numbers as used for the carrier board and interface/control board 40 and 60 of FIGS. 5 and 6, in that these boards can be similar and are preferably identical to the carrier board 40 of FIG. 5 and the interface/control board 60 of FIG. 6, with the exception that their respective high-speed board-to-board connectors 58 and 64 are located near the adjacent edges 56 and 68 of the boards 40 and 60, instead of being located within the interior surface regions of the boards 40 and 60. The SSDs 30 are labeled as SSD1, SSD2 and SSD3 in FIG. 8. The SSDs 30 labeled as SSD1 and SSD2 lie in the same plane on one side of the carrier board 40, while the SSDs 30 labeled as SSD2 and SSD3 are said to overlap each other because they are located directly opposite each other on opposite sides of the carrier board 40. A male connector 50a of the carrier board 40 is represented as available for connecting to a fourth SSD. It should be understood that the SSDs 20 of FIG. 2 could be used in place of the SSDs 30, as well as other SSDs if configured for connecting to the carrier board.

As with the assembly 80 of FIG. 7, the drive unit 82 of FIG. 8 shows the SSDs 30 as oppositely oriented to each other, so that their inward-facing female connectors 34 are directly connected to the male connectors 50a/b or 50c/d at opposite edges 52 and 54 of the carrier board 40 so as to be disposed at opposite sides of the unit 82, and their connectors 34 are between the circuit boards 32 of the SSDs 30 so as to face each other and be contained within the interior of the assembly 82. The enclosure 84 may have a standard drive form factor, such as a 3.5 inch drive form factor conventional in the art.

In view of the descriptions of FIGS. 2 through 8, it can be seen that the present invention provides compact, fully-integrated and modular mass storage solutions for computer systems. The preferred SATA SSDs 20 and 30 deviate from conventional designs in that each features a female connector 24/34 that faces toward the interior surface area of its circuit board 22/32, instead of a male connector facing outward from the board 22/32 as conventionally done in the prior art (FIG. 1). Female SATA connectors are readily available as a standard part used in laptops and notebooks and in the majority of cases will not require any modification of the circuit boards 22/32 of the SSDs 20/30.

As evident from FIGS. 7 and 8, configurations made possible with this invention allow for direct plug connections into the carrier board 40 without any additional cabling or connectors, and result in a highly economic usage of space, enabling the entire assembly 80 or drive unit 82 to have a standard 3.5 inch form factor used for HDDs drives.

In preferred embodiments of the carrier board 40 of FIG. 4, the host bus adapter is the SATA-to-SATA RAID controller IC chip 44 represented in FIG. 4, though a SATA port replicator mounted on the carrier board 40 could be used. The controller IC chip 44 splits one incoming SATA signal lane into at least two SATA signal lanes that are routed through the carrier board 40 to the SSDs via the SATA connectors 24, 34 and 50a-d. As evident from FIG. 4, in addition to controller IC chip 44, the carrier board 40 may feature additional ROM 48 to store configuration files or non-volatile journaling memory, as well as a volatile memory-based cache 46.

In the embodiment represented in FIGS. 5 and 6, control logic 70 can be provided on the interface/control board 60, so as to be separate from the carrier board 40 and connected to the latter by high-speed connectors 58 and 64 to allow more complex control logic configurations, such as the control logic 70 shown in FIG. 6 as including the SATA-to-PCIe translator 72, the PCIe-to-dual channel PATA translator 74, and the PATA-to-SATA multi-IC bridge 76. In alternative embodiments, the primary data connection can be a SAS connector with a 1-4 lane splitting control logic.

As evident from FIGS. 7 and 8, the entire configuration can be housed in an enclosure compatible with industry standard mounting racks or drive bays to serve as a substitute for a large capacity hard-disk drive.

While the invention has been described in terms of specific embodiments, it is apparent that other forms could be adopted by one skilled in the art. For example, the mass storage device could differ in appearance and construction from the embodiments shown in the Figures, and functions of components could be performed by components of different construction or design but capable of a similar (though not necessarily equivalent) function. Therefore, the scope of the invention is to be limited only by the following claims.

The invention claimed is:

1. A method of assembling a mass storage device for a computer system, the method comprising:

providing a carrier board comprising a circuit board functionally connected to a control logic and secondary connectors disposed at different edges of the circuit board and functionally connected to the control logic through the circuit board; and directly connecting at least two solid state drives to at least two of the secondary connectors of the carrier board to provide power and data connections therebetween, each of the solid state drives having a power and data connector that faces an interior surface region of the solid state drive and is directly connected to one of the secondary connectors of the carrier board, the solid state drives being mounted by the connectors so as to be oriented substantially parallel to the carrier board and to each other.

2. The method according to claim 1, wherein the secondary connectors of the carrier board are male connectors that face outward from the carrier board, and the power and data connector of each of the solid state drives is a female connector.

3. The method according to claim 1, wherein the edges at which the secondary connectors are disposed are opposite edges of the circuit board, the carrier board is positioned between the solid state drives, and the solid state drives overlap each other.

4. The method according to claim 1, wherein the solid state drives are in the same plane on one side of the carrier board.

5. The method according to claim 1, wherein the control logic is mounted on the circuit board of the carrier board and is connected to a primary connector means comprising an edge connector disposed on an edge of the circuit board.

6. The method according to claim 1, wherein the control logic is mounted on an interface/control board and is connected to a primary connector means comprising an edge connector disposed on an edge of the interface/control board, the method further comprising connecting the interface/control board to the carrier board so as to functionally connect the circuit board of the carrier board to the control logic on the interface/control board.

7. The method according to claim 1, further comprising the step of placing the carrier board and the solid state drives in an enclosure conforming to an industry standard hard disk drive form factor.

* * * * *